United States Patent
Yoneda et al.

(10) Patent No.: US 11,166,383 B2
(45) Date of Patent: Nov. 2, 2021

(54) RESIN-CLAD COPPER FOIL, COPPER-CLAD LAMINATED PLATE, AND PRINTED WIRING BOARD

(71) Applicant: MITSUI MINING & SMELTING CO., LTD., Tokyo (JP)

(72) Inventors: Yoshihiro Yoneda, Ageo (JP); Toshifumi Matsushima, Ageo (JP); Toshihiro Hosoi, Ageo (JP); Fujio Kuwako, Saitama (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 0 days.

(21) Appl. No.: 15/743,466

(22) PCT Filed: Jul. 8, 2016

(86) PCT No.: PCT/JP2016/070332
§ 371 (c)(1),
(2) Date: Jan. 10, 2018

(87) PCT Pub. No.: WO2017/014079
PCT Pub. Date: Jan. 26, 2017

(65) Prior Publication Data
US 2018/0206345 A1  Jul. 19, 2018

(30) Foreign Application Priority Data
Jul. 23, 2015 (JP) .............................. JP2015-146158

(51) Int. Cl.
*H05K 3/38* (2006.01)
*B32B 15/08* (2006.01)
(Continued)

(52) U.S. Cl.
CPC ............. *H05K 3/386* (2013.01); *B32B 15/08* (2013.01); *B32B 15/088* (2013.01);
(Continued)

(58) Field of Classification Search
CPC ........ H05K 3/386; H05K 3/022; B32B 15/08; B32B 15/088; B32B 15/092
See application file for complete search history.

(56) References Cited

U.S. PATENT DOCUMENTS

| 4,377,652 A * | 3/1983 | Ohmura ................. C08K 5/54 |
| | | 524/104 |
| 2007/0074896 A1* | 4/2007 | Tanaka ................. H05K 1/0353 |
| | | 174/259 |

(Continued)

FOREIGN PATENT DOCUMENTS

| CN | 104519657 A | 4/2015 |
| JP | 2006-131690 A | 5/2006 |

(Continued)

OTHER PUBLICATIONS

Polyamide-66-Nylon-66-PA-66 (Year: 2001).*
(Continued)

*Primary Examiner* — Callie E Shosho
*Assistant Examiner* — John Vincent Lawler
(74) *Attorney, Agent, or Firm* — Greenblum & Bernstein, P.L.C.

(57) ABSTRACT

There is provided a resin-coated copper foil including a resin layer having excellent dielectric characteristics suitable for high frequency applications, exhibiting high interlayer adhesion and heat resistance in the case where the resin layer is used in a copper-clad laminate or printed circuit board. The resin-coated copper foil of the present invention includes a copper foil and a resin layer on at least one side of the copper foil. The resin layer comprises a resin mixture containing an epoxy resin, a polyimide resin, and an aromatic polyamide resin; and an imidazole curing catalyst.

10 Claims, 2 Drawing Sheets

(51) Int. Cl.
- *B32B 15/088* (2006.01)
- *B32B 15/092* (2006.01)
- *H05K 1/03* (2006.01)
- *H05K 3/02* (2006.01)
- *H05K 3/06* (2006.01)
- *H05K 1/09* (2006.01)

(52) U.S. Cl.
CPC ......... *B32B 15/092* (2013.01); *H05K 1/0373* (2013.01); *H05K 3/022* (2013.01); *H05K 3/06* (2013.01); *H05K 1/09* (2013.01); *H05K 2201/0154* (2013.01); *H05K 2201/0209* (2013.01); *H05K 2201/0358* (2013.01); *H05K 2203/0278* (2013.01)

(56) References Cited

U.S. PATENT DOCUMENTS

| | | |
|---|---|---|
| 2008/0230261 A1 | 9/2008 | Tanaka et al. |
| 2010/0129604 A1 | 5/2010 | Uchida et al. |
| 2011/0127074 A1* | 6/2011 | Takahashi ................ C25D 3/38 174/257 |

FOREIGN PATENT DOCUMENTS

| | | | | |
|---|---|---|---|---|
| JP | 2006131690 A | * | 5/2006 | ............ B32B 15/08 |
| JP | 2006/274248 | * | 10/2006 | ............ C09J 161/06 |
| JP | 2006-328214 A | | 12/2006 | |
| JP | 2006328214 A | * | 12/2006 | ............ B32B 15/088 |
| JP | 3949676 A | | 7/2007 | |
| JP | 2008-284785 A | | 11/2008 | |
| JP | 2008284785 A | * | 11/2008 | ............ B32B 15/08 |
| JP | 2009-148962 A | | 7/2009 | |
| JP | 2009148962 A | * | 7/2009 | ............ B32B 15/08 |
| JP | 5118469 A | | 1/2013 | |
| JP | 2013/176965 | * | 9/2013 | ............ B32B 15/08 |
| JP | 2015-091644 A | | 5/2015 | |
| JP | 2015091644 A | * | 5/2015 | ............ B32B 15/088 |
| TW | 200914260 A | | 4/2009 | |
| TW | 201422419 A | | 6/2014 | |
| WO | 2009/145207 A1 | | 12/2009 | |
| WO | 2013/105650 A1 | | 7/2013 | |

OTHER PUBLICATIONS

Silica-Silicon-Dioxide-(SiO2) (Year: 2001).*
Suzuki—JP 2006-328214 A—ISR D3—MT—thermosetting resin and film attached product—2006 (Year: 2006).*
Tanaka—JP 2006-131690 A—MT—ISR D2—resin modifying material—2006 (Year: 2006).*
Uchida—JP 2008-284785 A—ISR D1—MT—copper foil w—resin layer—2008 (Year: 2008).*
Nakamura—JP 2009-148962 A—ISR D4—MT—copper foil+resin layer w—particles—2009 (Year: 2009).*
Mori—JP 2015-091644 A—ISR D5—MT—copper-clad laminate—polyimide w—dielectric values—2015 (Year: 2015).*
DEC-Kapton-summary-of-properties (Year: 2017).*
Kawakusu—JP 2013-176965 A—MT—copper clad laminate with end groups—2013 (Year: 2013).*
Noura—JP 2006-274248 A—MT—adhesive layer w-polyamide, epoxy, and polyimide—2006 (Year: 2006).*
Japanese Office Action issue with respect to application No. 2017-529553, dated Aug. 2, 2018, along with its English translation.
International Search Report and Written Opinion from Patent Application No. PCT/JP2016/070332, dated Sep. 6, 2016.
International Preliminary Report on Patentability from Patent Application No. PCT/JP2016/070332, dated Jan. 23, 2018.
Taiwan Office Action from Patent Application No. 105122437, dated May 24, 2017. .
Office Action from Chinese Patent Application No. 201680043034.6 dated Feb. 14, 2019 (and English translation thereof).
Office Action for Korean App. No. 10-2018-7001456 dated Mar. 29, 2019 (w/ translation).

* cited by examiner

RESIN-CLAD COPPER FOIL, COPPER-CLAD LAMINATED PLATE, AND PRINTED WIRING BOARD

TECHNICAL FIELD

The present invention relates to a resin-coated copper foil, a copper-clad laminate and a printed circuit board.

BACKGROUND ART

A known resin-coated copper foil is provided with a resin layer on one side to improve adhesion to a resin substrate such as a prepreg. Such a copper foil is used for manufacturing a copper-clad laminate or a printed circuit board. The prepreg is a generic term for a composite material prepared by impregnating a substrate, such as a synthetic resin plate, glass plate, glass woven fabric, glass nonwoven fabric, or paper, with a synthetic resin.

For example, Patent Document 1 (Japanese Patent No. 5118469) discloses a resin-coated copper foil provided with a resin layer containing filler particles on one side. The filler particle-containing resin layer is a semi-cured resin layer that contains an aromatic polyamide resin polymer, an epoxy resin, a curing accelerator, and filler particles treated with phenylaminosilane.

Patent Document 2 (Japanese Patent No. 3949676) discloses a copper foil with an extremely-thin adhesive layer or extremely-thin primer resin layer for securing high bonding adhesion to a resin substrate on one side of a copper foil without roughening treatment. The extremely-thin primer resin layer is formed with a resin mixture consisting of 20 to 80 parts by weight of an epoxy resin (containing a curing agent), 20 to 80 parts by weight of an aromatic polyamide resin polymer, and a curing accelerator added as required. This extremely-thin primer resin layer functions as an extremely-thin adhesive layer for securing high bonding adhesion to a resin substrate.

Furthermore, Patent Document 3 (WO2013/105650) discloses a copper foil with an adhesive layer on one side. The adhesive layer is composed of a resin composition that contains 5 parts by mass to 65 parts by mass (inclusive) of a styrene butadiene block copolymer relative to 100 parts by mass of a polyphenylene ether compound.

Printed circuit boards are widely used for electronic devices, such as portable electronic devices. In recent years, sophistication of electronic devices, such as portable electronic devices, require high frequency signals for high-speed processing of large amounts of information, and thus printed circuit boards suitable for high frequency applications. Such a high frequency printed circuit board requires a reduction in transmission loss to ensure transmission of high frequency signals without deterioration of their quality. The printed circuit board is provided with a trace pattern of a copper foil and an insulating resin substrate, and the transmission loss consists mainly of the conductor loss caused by the copper foil and the dielectric loss caused by the insulating resin substrate.

CITATION LIST

Patent Documents

Patent Document 1: Japanese Patent No. 5118469
Patent Document 2: Japanese Patent No. 3949676
Patent Document 3: WO2013/105650

SUMMARY OF THE INVENTION

Accordingly, in a resin-coated copper foil for high-frequency applications, the dielectric loss caused by the resin layer is desired to be reduced. For that purpose, the resin layer is required to have excellent dielectric characteristics, in particular, low dielectric loss tangent. Although the resin-coated copper foils disclosed in Patent Documents 1 and 2 can achieve an improvement in adhesion to a resin substrate, such as prepreg, they have high dielectric loss tangent and thus have unsatisfactory dielectric characteristics unsuitable for high frequency applications.

The present inventors have now found that a resin layer containing an epoxy resin, a polyimide resin, an aromatic polyamide resin, and an imidazole curing catalyst provided on at least one side of a copper foil has excellent dielectric characteristics suitable for high frequency applications and exhibit high interlayer adhesion and heat resistance in the case where the resin layer is used in a copper-clad laminate or a printed circuit board.

An object of the present invention is to provide a resin-coated copper foil including a resin layer having excellent dielectric characteristics suitable for high frequency applications, exhibiting high interlayer adhesion and heat resistance in the case where the resin layer is used in a copper-clad laminate or printed circuit board.

According to one aspect of the present invention, there is provided a resin-coated copper foil comprising a copper foil and a resin layer on at least one side of the copper foil, wherein the resin layer comprises a resin mixture containing an epoxy resin, a polyimide resin, and an aromatic polyamide resin; and an imidazole curing catalyst.

According to another aspect of the present invention, there is provided a copper-clad laminate comprising the resin-coated copper foil according to the above aspect, wherein the resin layer is in a cured state.

According to another aspect of the present invention, there is provided a printed circuit board comprising the resin-coated copper foil according to the above aspect, wherein the resin layer is in a cured state.

DESCRIPTION OF EMBODIMENT

Resin-Coated Copper Foil

The resin-coated copper foil of the present invention includes a copper foil and a resin layer on at least one side of the copper foil. In the resin-coated copper foil, the resin layer contains a resin mixture and an imidazole curing catalyst. The resin mixture includes an epoxy resin, a polyimide resin, and an aromatic polyamide resin. The resin layer containing an epoxy resin, a polyimide resin, an aromatic polyamide resin, and an imidazole curing catalyst has excellent dielectric characteristics (low dielectric loss tangent) suitable for high frequency applications and exhibit high interlayer adhesion and heat resistance in the case where the resin layer is used in a copper clad laminate or a printed circuit board. Such high adhesion between the copper foil and the resin layer and high heat resistance can effectively prevent defects such as circuit separation in the case where the resin layer is used for manufacturing a copper-clad laminate or a printed circuit board, resulting in an improved product yield. In addition, the low dielectric loss tangent contributes to a decrease in dielectric loss, and thus can reduce the transmission loss in high frequency applications. The resin-coated copper foil of the present invention can be adopted as an insulating layer and a conductor layer for printed circuit boards for high frequency digital communication in network equipment. Examples of such network equipment include (i) servers in base stations and routers, (ii) in-house networks, and (iii) core systems for high speed mobile communications.

Specifically, in the resin-coated copper foil of the present invention, the resin layer in a cured state preferably has a dielectric loss tangent of less than 0.020 at a frequency of 1 GHz, more preferably less than 0.015, still more preferably less than 0.008. The value of the dielectric loss tangent is typically 0.001 or more, more typically 0.002 or more. The resin-coated copper foil of the present invention preferably has a peel strength of at least 0.20 kgf/cm more preferably at least 0.40 kgf/cm, and still more preferably at least 0.60 kgf/cm between the resin layer in a cured state and the copper foil, measured in accordance with JIS C 6481-1996. The peel strength is typically 1.4 kgf/cm or less, more typically 1.2 kgf/cm or less.

The resin layer contains a resin mixture and an imidazole curing catalyst. The resin mixture includes an epoxy resin, a polyimide resin, and an aromatic polyamide resin.

Any epoxy resins having two or more epoxy groups per molecule and usable for electric and electronic materials can be used. Examples of the epoxy resin include bisphenol A epoxy resins, bisphenol F epoxy resins, bisphenol S epoxy resins, phenol novolac epoxy resins, biphenyl novolac epoxy resins, cresol novolac epoxy resins, alicyclic epoxy resins, glycidyl amine epoxy resins, naphthalene epoxy resins, anthracene epoxy resins, dicyclopentadiene epoxy resins, and any combination thereof. From the viewpoint of ensuring high heat resistance of the cured product, aromatic epoxy resins or polyfunctional epoxy resins are preferred, and phenol novolac epoxy resins, naphthalene epoxy resins, cresol novolac epoxy resins and biphenyl novolac epoxy resins are more preferred.

The polyimide resin contributes to improvements in dielectric characteristics (in particular, a reduction in dielectric loss tangent). The content of the polyimide resin in the resin mixture is preferably 160 to 340 parts by weight, more preferably 200 to 300 parts by weight, and even more preferably 220 to 280 parts by weight, relative to 100 parts by weight of the epoxy resin. The resin mixture having such a content of the polyimide resin can exhibit excellent dielectric characteristics while ensuring high heat resistance. Any polyimide resin having desired dielectric characteristics, and high adhesion and heat resistance can be used. From the viewpoint of forming a varnish and a coating film which are highly compatible with the epoxy resin, a polyimide resin soluble in an organic solvent (hereinafter, referred to as organic solvent-soluble polyimide) is preferred. The organic solvent in which the polyimide resin is soluble preferably has a solubility parameter (SP value) of 7.0 to 17.0. Preferred examples of such organic solvents include methyl ethyl ketone, toluene, xylene, N-methylpyrrolidone, dimethylacetamide, dimethylformamide, cyclopentanone, cyclohexanone, cyclohexane, methylcyclohexane, ethylene glycol, ethylene glycol dimethyl ether, ethylene glycol acetate, and any combinations thereof. In particular, it is preferred to use a polyimide resin having at least one functional group reactive with an epoxy group at the molecular end(s) from the viewpoint of ensuring high heat resistance after curing. In detail, it is preferred that the polyimide resin have at least one functional group selected from the group consisting of a carboxyl group, a sulfonic acid group, a thiol group, and a phenolic hydroxyl group at the terminal(s) or side chain(s) of the molecule. The presence of such a functional group improves the solubility of the polyimide resin in the organic solvent and compatibility with the epoxy resin, and also promotes the polymerization reaction with the epoxy resin during heat treatment, and further promotes the polymerization reaction between the polyimide resins to prepare a cured product having high heat resistance and low dielectric tangent. Among these, more preferred are polyimide resins having terminal or side carboxyl functional groups.

Preferred examples of the organic solvent-soluble polyimide include imidized products of tetracarboxylic acid dianhydrides and diamines. Examples of the tetracarboxylic acid dianhydride include 2,2-bis(3,4-dicarboxyphenyl)propane dianhydride, 2,2-bis(2,3-dicarboxyphenyl)propane dianhydride, bis(3,4-dicarboxyphenyl)sulfone dianhydride, bis(3,4-dicarboxyphenyl)ether dianhydride, 2,2-bis(3,4-dicarboxyphenyl)hexafluoropropane dianhydride, 2,2-bis[4-(3,4-dicarboxyphenyl)phenyl]propane dianhydride, pyromellitic dianhydride, 3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl) methane dianhydride, 1,2,5,6-naphthalene tetracarboxylic dianhydride, 2,3,6,7-naphthalene tetracarboxylic dianhydride, 2,3,5,6-pyridine tetracarboxylic dianhydride, 3,4,9,10-perylenetetracarboxylic dianhydride; derivatives thereof each having an alkyl substituent or a halogen substituent on its aromatic ring; and any combination thereof. Among these, from the viewpoint of improving the heat resistance of the resin composition, polyimide resins mainly composed of 2,2-bis(3,4-dicarboxyphenyl)hexafluoropropane dianhydride, 2,2-bis[4-(3,4-dicarboxyphenyl)phenyl]propane dianhydride, 2,3,3',4'-biphenyltetracarboxylic dianhydride, or 2,2',3,3'-biphenyltetracarboxylic dianhydride is preferred.

Examples of diamines include 3,4'-diaminodiphenyl sulfide, 4,4'-diaminodiphenyl sulfide, 3,4'-diaminodiphenyl ether, 4,4'-diaminodiphenyl ether, 3,4'-diaminodiphenylsulfone, 4,4'-diaminodiphenylsulfone, bis[4-(4-aminophenoxy)phenyl]sulfone, bis[4-(3-aminophenoxy)phenyl]sulfone, bis(4-aminophenoxy)biphenyl, bis[4-(4-aminophenoxy)phenyl]ether, 1,4-bis(4-aminophenoxy)benzene, 1,3-bis(4-aminophenoxy)benzene, 2,2-bis[4-(4-aminophenoxy)phenyl]hexafluoropropane, 2,2-bis[4-(4-aminophenoxy)phenyl]propane, 1,3-bis(aminomethyl)cyclohexane, and any combination thereof.

In particular, an isolated polyimide resin having a dielectric constant of 2.0 to 5.0 and a dielectric loss tangent of 0.001 to 0.008 at a frequency of 1 GHz is preferred for preparation of the resin composition of the present invention, and an isolated polyimide resin having a dielectric constant of 2.0 to 3.0 and a dielectric loss tangent of 0.001 to 0.005 is more preferred.

The isolated polyimide resin has a softening point of preferably 70° C. or higher, more preferably 90° C. or higher, still more preferably 120° C. or higher from the viewpoint of sufficiently maintaining the heat resistance of the cured product. The softening point can be determined in accordance with JIS K 7196: 2012. The term "isolated polyimide resin" refers to a solidified product resulting from evaporating the solvent from a varnish containing a dissolved polyimide until the solvent content reaches 0.1% by weight or less. The isolated polyimide resin has a glass transition point of preferably 130° C. or higher, more preferably 150° C. to 190° C. from the viewpoint of maintaining high heat resistance of the cured product while maintaining the solubility in an organic solvent. This glass transition point is determined by dynamic viscoelasticity measurement.

The aromatic polyamide resin contributes to an improvement in heat resistance of the resin layer. A preferred content of the aromatic polyamide resin in the resin mixture is 50 to 200 parts by weight, more preferably 80 to 150 parts by weight, and even more preferably 90 to 120 parts by weight based on 100 parts by weight of the epoxy resin. The resin mixture having such a content of the epoxy resin can exhibit high heat resistance while ensuring satisfactory dielectric characteristics. The aromatic polyamide resin is synthesized by polycondensation of an aromatic diamine and a dicarboxylic acid. Examples of the aromatic diamine used for the polycondensation include 3,4'-diaminodiphenyl ether, 4,4'-diaminodiphenyl ether, 4,4'-diaminodiphenylmethane, 3,3'-diaminodiphenylsulfone, m-xylenediamine, 3,3'-oxydianiline, and any combination thereof. Examples of the dicarboxylic acid used for the polycondensation include oxalic acid, malonic acid, succinic acid, glutaric acid, adipic acid, pimelic acid, suberic acid, azelaic acid, sebacic acid, phthalic acid, isophthalic acid, terephthalic acid, fumaric acid, and any combination thereof. Aromatic dicarboxylic acids are particularly preferred from the view point of imparting high heat resistance to the aromatic polyamide resin. Examples of the aromatic dicarboxylic acid include phthalic acid, isophthalic acid, terephthalic acid, fumaric acid, and combination thereof. In particular, aromatic polyamide resins containing phenolic hydroxyl groups in the molecules are preferred. In addition, the aromatic polyamide resins may have chemical bonds which impart flexibility to the aromatic polyamide resin chain to such an extent that heat resistance is not impaired. The aromatic polyamide resins may be partially present in aggregated states in the form of crosslinkable polymer alloys with the polyamide resins. Examples of the compound giving a chemical bond that imparts flexibility to the aromatic polyamide resin include butadiene, ethylene-propylene copolymers, styrene-butadiene copolymers, carboxylic acid-butadiene copolymers, acrylonitrile-butadiene copolymers, polyurethanes, polychloroprene, and siloxanes.

The imidazole curing catalyst after the curing reaction with the epoxy resin is taken into the molecular structure as part of the epoxy resin without being released in the form of ions, resulting in improved dielectric characteristics and insulation reliability of the resin layer. The content of the imidazole curing catalyst is not restricted. The amount for desirable curing can be appropriately determined in view of various conditions, such as the composition of the resin layer. Examples of imidazole curing catalysts include 2-undecylimidazole, 2-heptadecylimidazole, 2-ethyl-4-methylimidazole, 2-phenyl-4-methylimidazole, 1-cyanoethyl-2-undecylimidazole, 1-cyanoethyl-2-ethyl-4-methylimidazole, 2-ethyl-4-methylimidazole, 1-cyanoethyl-2-phenylimidazole, 2-phenyl-4,5-dihydroxymethylimidazole, 2-phenyl-4-methyl-5-hydroxymethyl imidazole, 2-methylimidazole, and any combination thereof. Preferred examples of imidazole curing catalysts include 2-methylimidazole, 2-ethyl-4-methylimidazole, 2-phenyl-4-methylimidazole, and 2-phenyl-4-methyl-5-hydroxymethylimidazole. Among them, preferred examples are imidazole curing catalysts having a phenyl group, such as 2-phenyl-4-methylimidazole and 2-phenyl-4-methyl-5-hydroxymethylimidazole, from the viewpoint of chemical stability in a semi-cured (B stage) state of the resin layer. Among them, 2-phenyl-4-methyl-5-hydroxymethylimidazole is particularly preferred.

Optionally, the resin layer may further contain an inorganic filler. An inorganic filler can desirably be added to reduce the dielectric tangent of the resin layer. Any known inorganic fillers compounded in the resin composition can appropriately be used. Examples of preferred inorganic fillers include particles of silica, alumina, and talc, and silica particles are particularly preferred from the viewpoint of reducing the dielectric loss tangent. The inorganic filler may have any particle size. From the viewpoint of maintaining the surface smoothness of the resin layer and reducing aggregation during mixing of the varnish, the mean particle size D50 measured with a mean particle size laser diffraction/scattering particle size distribution analyzer is preferably 0.01 to 2.0 µm, more preferably 0.01 to 1.0 µm, further preferably 0.01 to 0.5 µm. The content of the inorganic filler in the resin layer is preferably 10 to 100 parts by weight based on 100 parts by weight of the total amount of the epoxy resin, the polyimide resin and the aromatic polyamide resin (that is, resin solid content), more preferably 10 to 70 parts by weight, still more preferably 30 to 70 parts by weight, particularly preferably 30 to 50 parts by weight. The resin layer having such a content of the inorganic filler can avoid a decrease in peel strength while having excellent low dielectric loss tangent.

In the case of containing an inorganic filler, filler particles after specific surface treatment are preferably used. This can further improve the adhesion between the resin layer and the copper foil, so that the resin-coated copper foil and the prepreg can more firmly adhere to each other. As a result, the peel strength can be further improved and the occurrence of delamination can be reduced. In particular, the filler particles are preferably surface-treated with a silane coupling agent. Various silane coupling agent can be used, for example, amino functional silane coupling agents, acrylic functional silane coupling agents, methacryl functional silane coupling agents, epoxy functional silane coupling agents, olefin functional silane coupling agents, mercapto functional silane coupling agents, and vinyl functional silane coupling agents. Among them, amino functional silane coupling agents, acrylic functional silane coupling agents, methacryl functional silane coupling agents, and vinyl functional silane coupling agents are preferred. Thus, the surface treatment on the filler particles can improve the wettability with a solvent to favorably disperse the filler particles in the resin solution, resulting in a resin layer containing the uniformly dispersed filler particles. The surface treatment on the filler particles can improve the compatibility between the filler particles and the resin composition, resulting in high adhesion between them. Examples of the amino functional silane coupling agents include N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethylbutylidene)propylamine, and N-phenyl-3-aminopropyltrimethoxysilane. Examples of the methacryl functional silane coupling agent and the acryl functional silane coupling agent include 3-methacryloxypropylmethyldimethoxysilane, 3-methacryloxypropyltrimethoxysilane, 3-methacryloxypropylmethyldiethoxysilane, 3-methacryloxypropyltriethoxysilan, and 3-acryloxypropyltrimethoxysilane. Examples of the vinyl-functional silane coupling agent include vinyltrimethoxysilane, vinyltriethoxysilane, and vinylphenyltriethoxysilane. In addition, alkoxysilanes such as methyltrimethoxysilane, dimethyldimethoxysilane, phenyltrimethoxysilane, methyltriethoxysilane, dimethyldiethoxysilane, phenyltriethoxysilane may be used. The method of surface treatment with these silane coupling agents is not particularly restricted, and any suitable method can be used as appropriate.

The resin layer can have any thickness. The resin layer has a thickness of preferably 0.1 to 100 μm, more preferably 0.5 to 70 μm, still more preferably 1.0 to 50 μm. The resin layer having a thickness within these ranges can be readily formed by application of a resin composition and can ensure sufficient adhesion to the copper foil.

The resin layer itself may function as an insulating layer in a copper-clad laminate or in a printed circuit board. Alternatively, the resin layer may be formed on the surface of the copper foil as a primer layer to be laminated to the prepreg in the copper-clad laminate or in the printed circuit board. In this case, the resin layer in the resin-coated copper foil serves as a primer layer to improve the adhesion between the prepreg and the copper foil. Thus, the resin-coated copper foil of the present invention may be provided with a prepreg on the resin layer. This resin layer may be formed by curing the resin composition, or may be provided in the form of a resin composition layer containing the resin composition in a semi-cured (B stage) state to be later subjected to adhesion curing by hot pressing. Such hot pressing that can be adopted is vacuum hot pressing involving preliminarily evacuation to vacuum and then curing under conditions of a temperature of 150 to 300° C., a temperature holding time of 30 to 300 min, and a pressure of 10 to 60 kgf/cm$^2$.

The copper foil may be a metal foil as electrodeposited or rolled (so-called raw foil), or may be surface-treated foil at least one surface of which is treated. Various surface treatments may be employed for improving the properties (for example, rust-proofing resistance, moisture resistance, chemical resistance, acid resistance, heat resistance, and adhesion to the substrate) of the surface of the metal foil or imparting these properties to the surface of the metal foil. The surface treatment may be performed on one surface or two surfaces of the metal foil. Examples of the surface treatment on the copper foil include rust-proofing treatment, silane treatment, roughening treatment, and barrier-forming treatment.

The surface, adjacent to the resin layer, of the copper foil has a ten-point average roughness Rzjis of preferably 2.0 μm or less, more preferably 1.5 μm or less, more preferably 1.0 μm or less, measured in accordance with JIS B 0601-2001. The surface having such a low Rzjis can desirably reduce transmission loss in high frequency applications. That is, conductor loss which can be increased by the skin effect of the copper foil, which appears more remarkably as the frequency increases, can be reduced, resulting in a further reduction in transmission loss. The lower limit of the ten-point average roughness Rzjis of the surface, adjacent to the resin layer, of the copper foil is not defined. From the viewpoint of improving the adhesion to the resin layer, Rzjis is preferably 0.005 μm or more, more preferably 0.01 μm or more, still more preferably 0.05 μm or more.

The particulate protrusions are preferably formed on the surface, adjacent to the resin layer, of the copper foil from the viewpoint that the heat resistant adhesion to the resin layer can be markedly improved within the numerical range of the ten-point average roughness Rzjis. The metal having the particulate protrusions is preferably copper from the viewpoint that the high frequency transmission loss of the printed circuit board can be reduced. The particulate protrusions have a mean particle size of preferably 10 to 300 nm, more preferably 50 to 200 nm in view of securing adhesion to the resin layer as a physical anchor effect while maintaining high frequency transmission characteristics of the wiring layer formed from the copper foil. From the above viewpoint, the particulate protrusions are preferably present at an areal density of 40 to 280/μm$^2$, more preferably 80 to 250/μm$^2$. These particulate protrusions can be distinguished from each other by observing the surface by scanning electron microscopy at a magnification of 5,000 to 50,000. The mean particle size can be calculated from the mean value of the area circle equivalent diameters of particle contours for arbitrary 20 particles. Examples of the method of forming the particulate protrusions include electrolytic treatment, blast treatment, and oxidation-reduction treatment. From the viewpoint of formation of uniform particles, electrolytic treatment is preferred, and copper electrolytic treatment is more preferred. For example, the particulate protrusions can be favorably formed by electrolytic plating using an aqueous solution having a copper content of 10 to 20 g/L, a free sulfuric acid content of 15 to 100 g/L, a 9-phenylacridine content of 100 to 200 mg/L, and a chlorine content of 20 to 100 mg/L.

The copper foil has any thickness, but preferably a thickness of 0.1 to 100 μm, more preferably 0.15 to 40 μm, still more preferably 0.2 to 30 μm. The copper foil having a thickness within such a range allows adoption of a common patterning processes for wiring on printed circuit board including MSAP (modified semi-additive process), SAP (semi-additive process), and subtractive process. However, in such a case as the copper foil has a thickness of 10 μm or less, the resin-coated copper foil of the present invention may be prepared by forming a resin layer on the copper foil surface of a copper foil with a carrier having a release layer in order to improve the handling properties.

Copper-Clad Laminate

The resin-coated copper foil of the present invention is preferably used for preparation of a copper-clad laminate for printed circuit boards. A preferred embodiment of the present invention provides a copper-clad laminate provided with the resin-coated copper foil or a copper-clad laminate prepared with the resin-coated copper foil. In this case, the resin layer of the resin-coated copper foil is cured. This copper-clad laminate comprises the resin-coated copper foil of the present invention and an insulating substrate layer provided in close contact with the resin layer of the resin-coated copper foil. In this case, the resin layer can function as a primer layer for improving the adhesion to the insulating substrate layer. The resin-coated copper foil may be provided on one side or on the two sides of the insulating resin layer. The insulating resin layer contains an insulating resin. The insulating substrate layer is preferably a glass fiber-containing prepreg, a glass plate, a ceramic plate, a resin film, or a combination thereof. Preferred examples of the insulating resin in the form of the prepreg include epoxy resin, cyanate ester resin, polyimide resin, bismaleimide triazine resin (BT resin), polyphenylene ether resin, and phenol resin. The resin layer may be composed of two or more layers. Among them, the polyphenylene ether resin and the polyimide resin are preferred in terms of improving the transmission characteristics of the copper-clad laminate, and the adhesion to the resin layer in the resin-coated copper foil of the present invention is particularly high. Examples of the insulating resin used as the resin film include polyimide resins and liquid crystal polymers. Various methods for forming the copper-clad laminate can be used. The typical method involves laminating the resin-coated copper foil of the present invention to the insulating substrate layer. In another method, the resin layer is formed on the insulating substrate layer, and then a copper foil is laminated on the surface of the resin layer to cure the insulating base layer and the resin layer. In other words, an embodiment providing the layer structure of the resin-coated metal foil afterward is also included in embodiments of the present invention.

Printed Circuit Board

The resin-coated copper foil of the present invention is preferably used in the production of printed circuit boards. That is, a preferred embodiment of the present invention provides a printed circuit board provided with the resin-coated copper foil or a printed circuit board prepared with the resin coated copper foil. In this case, the resin layer of the resin-coated copper foil is cured. The printed circuit board according to this embodiment includes a layer structure including an insulating resin layer and a copper layer laminated in this order. The insulating resin layer is described above in connection with the copper-clad laminate. In any case, the printed circuit board may have any known layer structure. Specific examples of the printed circuit board include single sided or double sided printed circuit boards prepared by forming circuits after bonding the resin-coated copper foil of the present invention to one or each surface of the prepreg into a cured laminate or a multilayer printed circuit board consisting of these printed circuit boards. Other specific examples thereof include a flexible printed circuit board, a chip-on-film (COF) board, a tape-automatic-bonding (TAB) tape, a build-up multilayer circuit board, which are formed in such a manner that the surface-treated copper foil according to the present invention is formed on the resin film to form a circuit and a direct build-up-on-wafers formed such that lamination of the resin-coated copper foil and circuit formation are alternately repeated on the semiconductor integrated circuit. In particular, the resin-coated copper foil of the present invention can be preferably applied as an insulating layer and a conductor layer for printed circuit boards for high frequency digital communication in network equipment. Examples of such network equipment include (i) servers in base stations and routers, (ii) in-house networks, and (iii) core systems for high speed mobile communications.

EXAMPLES

The present invention will be described in further detail with reference to the following examples.

Examples 1 to 10 and 14 to 19

A resin varnish containing a resin composition was prepared, and a resin-coated copper foil was produced with this resin varnish and evaluated. The detailed procedures are as follows.

(1) Preparation of Resin Varnish

The following resin components, an imidazole curing catalyst, and an inorganic filler were prepared as raw material components for a resin varnish. The inorganic filler was used only in Example 6.

Epoxy resin: YDCN-704 (cresol novolac type, epoxy equivalent: 210 g/Eq) manufactured by NIPPON STEEL & SUMIKIN CHEMICAL CO., LTD.

Polyimide Resin A: PIAD-300 (terminal functional group: carboxyl group, solvent: a mixture of cyclohexanone, methylcyclohexane, and ethylene glycol dimethyl ether, dielectric constant at 1 GHz: 2.70, dielectric loss tangent at 1 GHz: 0.003, and softening point: 140° C.) manufactured by Arakawa Chemical Industries, Ltd.

Polyimide Resin B: Solvent dilution of PI-2 (Terminal functional group: carboxyl group, main solvent: dimethylacetamide, dielectric constant at 1 GHz: 3.0, dielectric loss tangent at 1 GHz: 0.018, softening point: 150° C.) manufactured by T&K TOKA Corporation.

Aromatic polyamide resin: BPAM-155 (phenolic hydroxyl group-containing rubber modified type, hydroxyl group equivalent 4000 g/Eq) manufactured by Nippon Kayaku Co., Ltd.

Imidazole curing catalyst: 2P 4 MHZ manufactured by Shikoku Chemicals Corporation Inorganic filler: spherical silica, SC 1050-DJA (average particle diameter D50=0.3 µm, treated with surface aminosilane) manufactured by Admatechs Co., Ltd.

The raw material components for the resin varnish were weighed at the compounding ratios (weight ratio) shown in Tables 1 to 3. Organic solvents (25 parts by weight of dimethylacetamide and 75 parts by weight of cyclopentanone) were mixed to prepare a mixed solvent. Weighed raw material components for resin varnish and solvent were placed into a flask and stirred at 60° C. to dissolve the resin component in a solvent and the resin varnish was recovered.

(2) Evaluation of Isolated Resin

Figure 1:
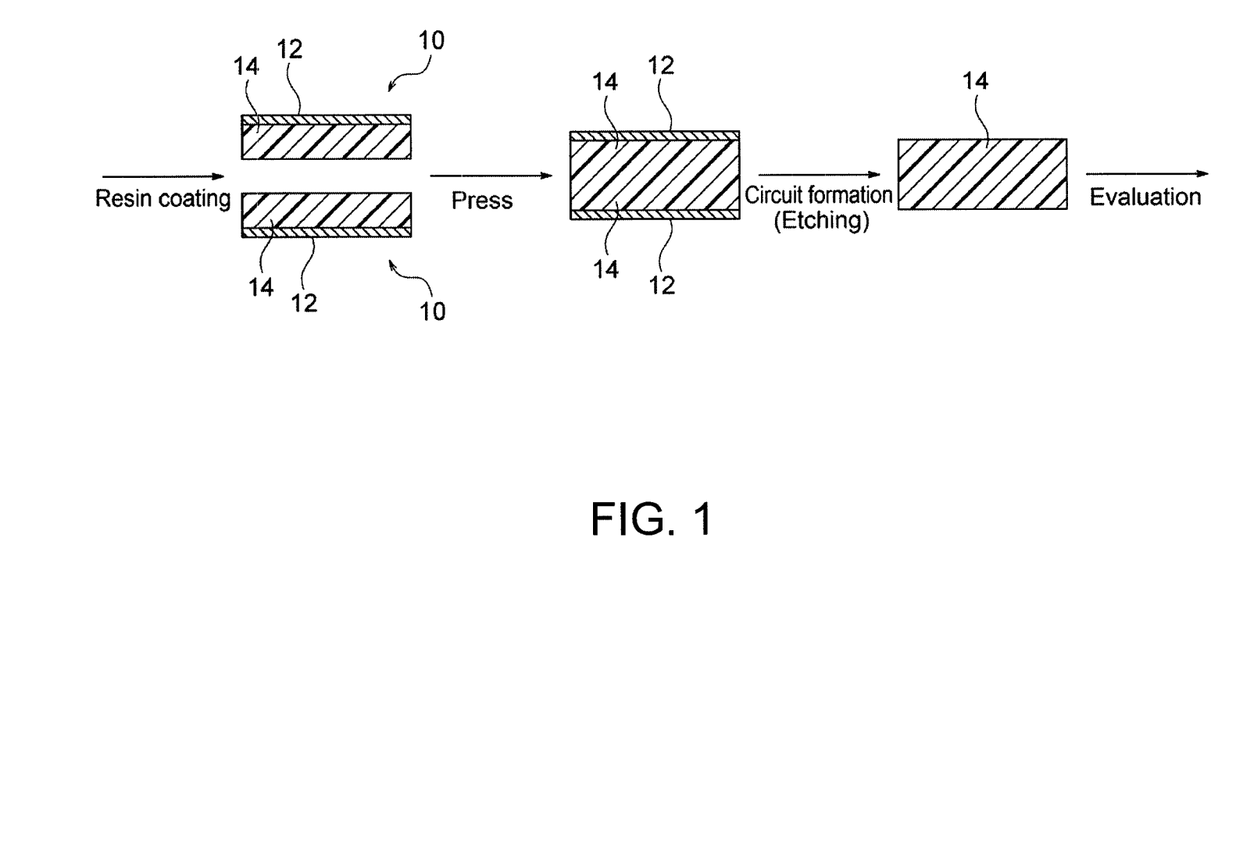
FIG. 1 is a diagram illustrating a procedure for preparing samples for evaluating dielectric characteristics in Examples 1 to 19.

The resin varnish obtained in the above (1) was applied to an electrode surface (ten point average roughness Rzjis: 0.5 µm, measured in accordance with JIS B 0601-2001) of an electrodeposited copper foil having a thickness of 18 µm such that the coating has a thickness of 50 µm after drying. The coated resin varnish was dried in an oven to be in a semi-cured (B stage) state. Thus, as shown in FIG. 1, two resin-coated copper foils 10 each having the resin layer 14 on one side of the copper foil 12 were prepared. As shown in FIG. 1, two resin-coated copper foils 10 were laminated such that the resin layers 14 were attached with each other and were subjected to vacuum press at 190° C. in a temperature holding time of 90 min under a pressure of 40 kgf/cm$^2$ to cure the resin layer 14. The thickness of the resulting cured resin layer 14 was 100 µm. The copper foil was etched away from the pressed laminate to prepare a resin film consisting of the resin layer 14 alone.

<Evaluation of Dielectric Characteristics—Dielectric Tangent>

The resulting resin film was subjected to a cavity resonator perturbation method using a network analyzer (PNA-L N5234 A manufactured by Keysight Technologies, Inc.) to measure the dielectric loss tangent at 1 GHz. This measurement was carried out in accordance with ASTM D2520 (JISC2565). The resulting dielectric loss tangent was rated in four stages in accordance with the following criteria.

A (very good): less than 0.008

B (good): 0.008 or more and less than 0.015

C (acceptable): 0.015 or more and less than 0.020

D (poor): 0.020 or more (3) Evaluation of Copper-Clad Laminate and Printed Circuit Board Including Resin Layer Used as Primer Layer (3-1) Preparation of Electrodeposited Copper Foil Electrodeposited copper foils A to C having a thickness of 18 μm were prepared by the following processes, respectively.

<Electrodeposited Copper Foil A>

A copper sulfate solution was electrolyzed with a titanium rotary cathode (surface roughness Ra=0.20 μm) and dimensionally stable anode (DSA) at 45° C. and a current density of 55 A/dm$^2$ to prepare a raw foil. The copper sulfate solution contained 80 g/L of copper, 140 g/L of free sulfuric acid, 30 mg/L of bis(3-sulfopropyl)disulfide, 50 mg/L of diallyldimethylammonium chloride polymer, and 40 mg/L of chlorine content. Surface treatments (a) to (c) were sequentially performed on the electrolyte surface of the raw foil.

(a) Formation of Zinc-Nickel Film
Potassium pyrophosphate content: 80 g/L
Zinc content: 0.2 g/L,
Nickel content: 2 g/L
Solution temperature: 40° C.
Current density: 0.5 A/dm$^2$ (b) Formation of Chromate Layer
Chromic acid content: 1 g/L, pH 11
Solution temperature: 25° C.
Current density: 1 A/dm$^2$ (c) Formation of Silane Layer
Silane coupling agent: 3-aminopropyltrimethoxysilane (3 g/L aqueous solution)
Liquid treatment: Showering The treated surface of the electrodeposited copper foil A had a ten-point average roughness Rzjis of 0.5 μm (measured in accordance with JIS B 0601-2001) and had no particulate protrusions.

<Electrodeposited Copper Foil B>

Particulate protrusions were formed on the electrolytic-solution surface of the raw foil of the electrodeposited copper foil A, and the surface treatment similar to that on the electrodeposited copper foil A was performed on the surface with particulate protrusions. The copper sulfate solution (copper content: 13 g/L, free sulfuric acid content 55 g/L, 9-phenylacridine content 140 mg/L, chlorine content 35 mg/L) was electrolyzed at 30° C. and a current density of 50 A/dm$^2$ to prepare particulate protrusions. The resulting surface-treated surface of the electrodeposited copper foil B had a ten-point average roughness Rzjis of 0.5 μm (in accordance with JIS B 0601-2001). The particulate protrusions had an average particle diameter of 100 nm measured by scanning electron microscopy and a particle density of 205/μm$^2$.

<Electrodeposited Copper Foil C>

After particulate protrusions were formed on the electrolytic-solution surface of the raw foil of the electrodeposited copper foil A, the surface treatment similar to that on the electrodeposited copper foil A was performed on the surface with particulate protrusions. The particle protrusions were formed by electrolytic treatment involving three steps. The electrolysis at the first step was carried out in a copper sulfate solution (copper content: 10.5 g/L, free sulfuric acid content: 220 g/L) at 30° C. and a current density of 28 A/dm$^2$. The electrolysis at the second step was carried out in a copper sulfate solution (copper content: 10.5 g/L, free sulfuric acid content: 220 g/L) at 30° C. and a current density of 16 A/dm$^2$. The electrolysis at the third stage was carried out in a copper sulfate solution (copper content: 70 g/L, free sulfuric acid content: 220 g/L) at 52° C. and a current density of 21 A/dm$^2$. The resulting surface-treated surface of the electrodeposited copper foil C had a ten-point average roughness Rzjis of 1.8 μm (in accordance with JIS B 0601-2001). The particulate protrusions had an average particle diameter of 1.0 μm measured by a scanning electron microscopy and a particle density of 1/μm$^2$.

(3-2) Preparation of Resin-Coated Copper Foil

The resin varnish prepared in procedure (1) was applied to the surface-treated surface of each electrodeposited copper foil into a coating thickness of 3.0 μm after drying. The coated resin varnish was dried in an oven so as to be in a semi-cured (B stage) state. Thus, resin-coated copper foils 20 each having a resin layer 24 on one side of the copper foil 22 were prepared.

<Evaluation of Heat Resistance—Thermal Endurance Time>

Figure 2:
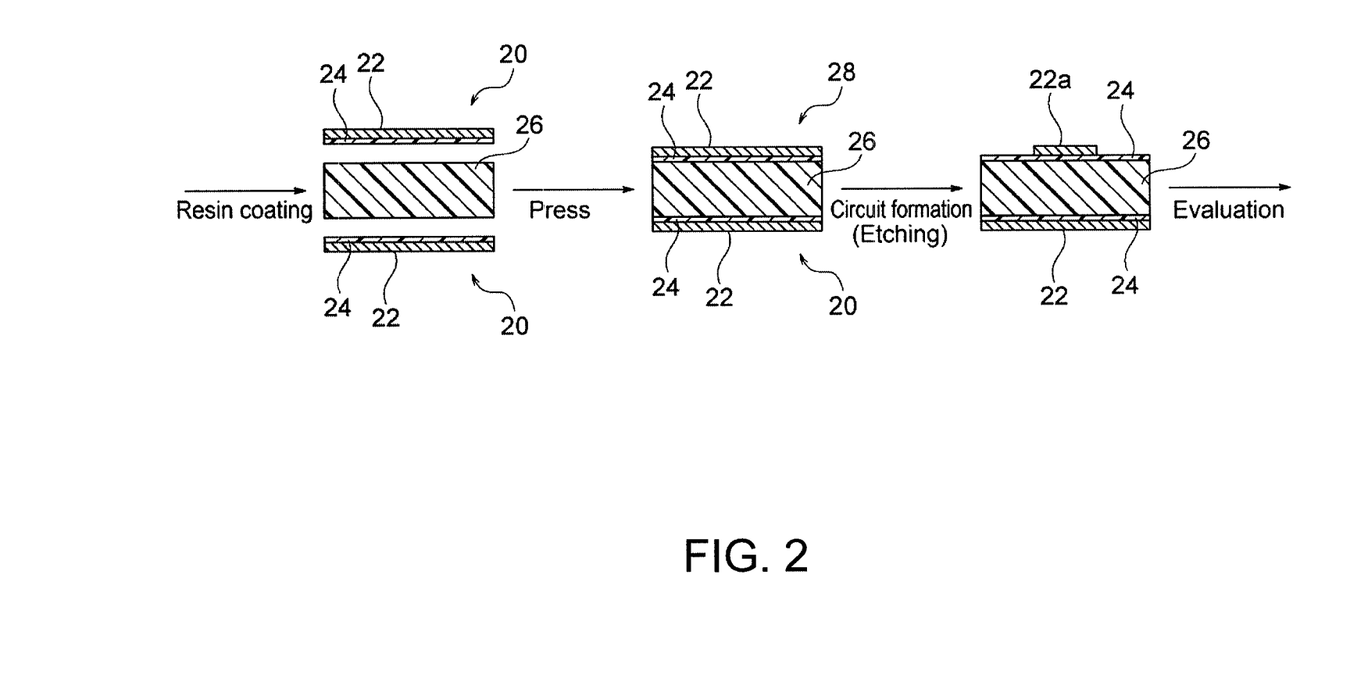
FIG. 2 is a diagram illustrating a procedure for preparing samples for evaluating heat resistance and adhesion of copper foil in Examples 1 to 19.

Two sheets of prepreg (MEGTRON-6 manufactured by Panasonic Corporation) were laminated into a resin substrate 26 having a thickness of 0.2 mm. As shown in FIG. 2, the resin layer 24 of the two resin-coated copper foils 20 was laminated on the two sides of the resin substrate 26 to be vacuum pressed under the conditions of a pressing temperature of 190° C., a temperature holding time of 120 min, and a pressing pressure of 30 kgf/cm$^2$ to prepare a copper clad laminate 28 with cured resin layers 24. The resulting cured resin layers 24 each had a thickness of 3.0 μm. It should be understood that the resin layer 24 functions as a primer layer for bonding to the resin substrate 26 in the production of the copper clad laminate 28. A substrate for evaluating heat resistance was prepared with the resulting copper-clad laminate 28. In detail, the copper clad laminate 28 was cut into a 6.35 mm×6.35 mm square substrate. The quartz probe heated to 288° C. of a thermomechanical analyzer (TMA) was brought into contact with the surface of the cut-out copper clad laminate 28 to measure the time (in min) until delamination (circuit peeling or substrate peeling). This measurement was carried out in accordance with IPC-TM-650 2.4.24.1. The results are shown in Tables 1 to 3.

AA (best for best): 120 min or more
A (very good): 60 min
B (good): 30 min or more and less than 60 min
C (acceptable): 10 min or more and less than 30 min
C (poor): Less than 10 min <Copper Foil Adhesion—Peel Strength>

A circuit for peel strength measuring test was formed on the resulting copper-clad laminate 28. Specifically, a dry film was laminated on the two sides of the copper clad laminate 28 to form an etching resist layer. Then, a circuit having a width of 10 mm for peel strength measuring test was exposed and developed on the etching resist layer on the two sides to form etching patterns. Then, circuit etching was performed with a copper etching solution, and the etching resist was removed to prepare a circuit 22a. The resulting circuit 22a was peeled off from the resin layer 24 to measure the peeling strength (kgf/cm) between the circuit 22a and the resin layer 24. The peel strength was measured in accordance with JIS C6481-1996. The results are shown in Tables 1 to 3.

A (very good): 0.60 kgf/cm or more
B (good): 0.40 kgf/cm or more and less than 0.60 kgf/cm
C (acceptable): 0.20 kgf/cm or more and less than 0.40 kgf/cm
D (poor): Less than 0.20 kgf/cm <Evaluation of Transmission Characteristics>

The resin-coated copper foil 20 with the resin as the outermost layer was laminated together with two prepregs (MEGTRON-6 manufactured by Panasonics Co., Ltd., actual thickness 68 μm) to prepare a double-sided copper-clad laminate 28 having a thickness of 0.14 mm. The copper foil was then patterned by etching to form a microstrip circuit. A pattern causing a circuit characteristic impedance of 50Ω was selected and the transmission loss S21 (db/cm) at 50 GHz was determined. The results are shown in Table 3.

A (good): −0.55 db/cm or more
B (acceptable): −0.70 db/cm or more

Example 11 (Comparative)

A resin varnish was prepared and evaluated as in Example 10 except that a phenol resin (MEH-7500, manufactured by Meiwa Plastic Industries, Ltd.) was used in place of the polyimide resin. The results are shown in Table 2.

Example 12 (Comparative)

A resin varnish was prepared and evaluated as in Example 1 except that the amount of the polyimide resin was reduced to 40 parts by weight (based on 100 parts by weight of the epoxy resin) and no aromatic polyamide resin was added. The results are shown in Table 2.

Example 13 (Comparative)

A resin varnish was prepared and evaluated as in Example 1 except that no polyimide resin was added and the amount of the aromatic polyamide resin was reduced to 50 parts by weight (based on 100 parts by weight of the epoxy resin). The results are shown in Table 2.

TABLE 1

| | | | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|---|---|
| Test condition | Proportion (parts by weight) of resin component | Epoxy resin | 100 | 100 | 100 | 100 | 100 | 100 | 100 | 100 | 100 | 100 |
| | | Polyimide resin A | 160 | 340 | 260 | 260 | 260 | 260 | 200 | 260 | 300 | 260 |
| | | Polyimide resin B | 0 | 0 | 0 | 0 | 0 | 0 | 0 | 0 | 0 | 0 |
| | | Phenol resin | 0 | 0 | 0 | 0 | 0 | 0 | 0 | 0 | 0 | 0 |
| | | Aromatic polyamide resin | 100 | 100 | 50 | 200 | 100 | 100 | 100 | 75 | 100 | 150 |
| | Amount of filler (parts by weight based on 100 parts by weight of total resin component) | | 0 | 0 | 0 | 0 | 0 | 40 | 0 | 0 | 0 | 0 |
| | Oxidation catalyst (parts by weight based on 100 parts by weight of total resin component) | | 1.0 | 1.0 | 1.0 | 1.0 | 1.0 | 1.0 | 1.0 | 1.0 | 1.0 | 1.0 |
| Evaluation of isolated resin | Dielectric loss tangent at 1 GHz | Measured value | 0.010 | 0.008 | 0.008 | 0.016 | 0.009 | 0.007 | 0.010 | 0.009 | 0.009 | 0.014 |
| | | Rank | B | B | B | C | B | A | B | B | B | B |
| Evaluation of resin layer as primer layer | Electrodeposited copper foil | | Copper foil A | Copper foil A | Copper foil A | Copper foil A | Copper foil A | Copper foil A | Copper foil A | Copper foil A | Copper foil A | Copper foil A |
| | Thermal endurance time (min) | Measured value | 50 | 40 | 30 | 60 or more | 60 or more | 60 or more | 50 | 40 | 60 or more | 60 or more |
| | | Rank | B | B | B | A | A | A | B | B | A | A |
| | Peel strength (kgf/cm) | Measured value | 0.76 | 0.81 | 0.88 | 0.70 | 0.81 | 0.70 | 0.72 | 0.85 | 0.80 | 0.74 |
| | | Rank | A | A | A | A | A | A | A | A | A | A |

TABLE 2

| | | | Ex. 11* | Ex. 12* | Ex. 13* | Ex. 14 | Ex. 15 | Ex. 16 |
|---|---|---|---|---|---|---|---|---|
| Test condition | Proportion (parts by weight) of resin component | Epoxy resin | 100 | 100 | 100 | 100 | 100 | 100 |
| | | Polyimide resin A | 0 | 40 | 0 | 0 | 260 | 260 |
| | | Polyimide resin B | 0 | 0 | 0 | 260 | 0 | 0 |
| | | Phenol resin | 260 | 0 | 0 | 0 | 0 | 0 |
| | | Aromatic polyamide resin | 0 | 0 | 50 | 100 | 100 | 100 |
| | Amount of filler (parts by weight based on 100 parts by weight of total resin component) | | 0 | 0 | 0 | 40 | 20 | 60 |
| | Oxidation catalyst (parts by weight based on 100 parts by weight of total resin component) | | 1.0 | 1.0 | 1.0 | 1.0 | 1.0 | 1.0 |
| Evaluation of isolated resin | Dielectric loss tangent at 1 GHz | Measured value | 0.032 | 0.019 | 0.016 | 0.018 | 0.008 | 0.005 |
| | | Rank | D | C | C | C | B | A |
| Evaluation of resin layer as primer layer | Electrodeposited copper foil | | Copper foil A | Copper foil A | Copper foil A | Copper foil A | Copper foil A | Copper foil A |
| | Thermal endurance time (min) | Measured value | 0 | 5 | 5 | 60 or more | 60 or more | 60 or more |
| | | Rank | D | D | D | A | A | A |
| | Peel strength (kgf/cm) | Measured value | 0.02 | 0.75 | 0.30 | 0.70 | 0.75 | 0.60 |
| | | Rank | D | A | C | A | A | A |

*denotes comparative examples.

TABLE 3

|  |  |  | Ex. 17 | Ex. 18 | Ex. 19 |
|---|---|---|---|---|---|
| Electrodeposited copper foil |  |  | Copper foil A | Copper foil B | Copper foil C |
| Resin layer composition |  |  | Same as Ex. 6 | Same as Ex. 6 | Same as Ex. 6 |
| Evaluation of resin layer as primer layer | Thermal endurance time (min) | Measured value | 60 or more | 120 or more | 120 or more |
|  |  | Evaluation | A | AA | AA |
|  | Peel strength (kgf/cm) | Measured value | 0.70 | 0.77 | 0.82 |
|  |  | Evaluation | A | A | A |
| Transmission loss (db/cm) |  | Measured value | −0.49 | −0.50 | −0.69 |
|  |  | Evaluation | A | A | B |

The invention claimed is:

1. A resin-coated copper foil comprising a copper foil and a resin layer on at least one side of the copper foil, wherein the resin layer comprises:
   a resin mixture containing
      an epoxy resin,
      a polyimide resin, and
      an aromatic polyamide resin; and
   an imidazole curing catalyst,
   wherein the resin mixture comprises 160 to 340 parts by weight of the polyimide resin and 50 to 200 parts by weight of the aromatic polyamide resin based on 100 parts by weight of the epoxy resin,
   wherein the polyimide resin in an isolated form has
      a dielectric constant of 2.0 to 3.0, and
      a dielectric loss tangent of 0.001 to 0.005 at a frequency of 1 GHz,
   wherein the polyimide resin has at least one functional group at a molecular end that is reactive with an epoxy group,
   wherein the copper foil is a roughened copper foil, and
   wherein the resin layer is free from an inorganic filler.

2. The resin-coated copper foil according to claim 1, wherein the resin mixture contains 200 to 300 parts by weight of the polyimide resin and 80 to 150 parts by weight of the aromatic polyamide resin based on 100 parts by weight of the epoxy resin.

3. The resin-coated copper foil according claim 1, wherein the surface, adjacent to the resin layer, of the copper foil has a ten-point average roughness Rzjis of 2.0 μm or less, measured in accordance with JIS B 0601-2001.

4. The resin-coated copper foil according to claim 1, wherein the surface, adjacent to the resin layer, of the copper foil has particulate projections having an average particle size of 10 to 300 nm.

5. The resin-coated copper foil according to claim 1, wherein particulate protrusions are present at an areal density of 40 to 280 particles/μm$^2$ on the surface, adjacent to the resin layer, of the copper foil.

6. The resin-coated copper foil according to claim 1, wherein the resin layer in a cured state has a dielectric loss tangent of less than 0.020 at a frequency of 1 GHz.

7. The resin-coated copper foil according to claim 1, having a peel strength of at least 0.40 kgf/cm between the resin layer in a cured state and the copper foil, measured in accordance with JIS C 6481-1996.

8. A copper-clad laminate, comprising the resin-coated copper foil according to claim 1, wherein the resin layer is cured.

9. A printed circuit board, comprising the resin-coated copper foil according to claim 1, wherein the resin layer is cured.

10. The resin-coated copper foil according to claim 1, wherein each of the functional groups is individually selected from the group consisting of a sulfonic acid group, a thiol group, and a phenolic hydroxyl group.

* * * * *